(12) United States Patent
Reilly et al.

(10) Patent No.: US 11,789,692 B2
(45) Date of Patent: Oct. 17, 2023

(54) CONTROL BASED ON PROXIMITY

(71) Applicant: Sonos, Inc., Santa Barbara, CA (US)

(72) Inventors: Jonathon Reilly, Cambridge, MA (US); Neil Griffiths, Lexington, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 17/562,547

(22) Filed: Dec. 27, 2021

(65) Prior Publication Data

US 2022/0229627 A1 Jul. 21, 2022

Related U.S. Application Data

(63) Continuation of application No. 16/779,634, filed on Feb. 2, 2020, now Pat. No. 11,210,055, which is a (Continued)

(51) Int. Cl.
| | |
|---|---|
| *G06F 3/01* | (2006.01) |
| *G06F 3/16* | (2006.01) |
| *H03G 3/04* | (2006.01) |
| *H03G 3/34* | (2006.01) |
| *H05B 47/115* | (2020.01) |
| *H03G 3/02* | (2006.01) |
| *F21V 23/04* | (2006.01) |
| *H04R 27/00* | (2006.01) |

(52) U.S. Cl.
CPC .......... *G06F 3/165* (2013.01); *F21V 23/0471* (2013.01); *G06F 3/011* (2013.01); *H03G 3/02* (2013.01); *H03G 3/04* (2013.01); *H03G 3/348* (2013.01); *H04R 27/00* (2013.01); *H05B 47/115* (2020.01); *H04R 2227/005* (2013.01); *H04R 2430/01* (2013.01)

(58) Field of Classification Search
CPC ...... H04R 2430/01; H04R 27/00; H04R 3/04; H04R 3/02; G06F 3/165; G06F 3/017; F21V 23/0471
USPC .......................................... 381/77–83, 58–59
See application file for complete search history.

(56) References Cited

U.S. PATENT DOCUMENTS

| | | |
|---|---|---|
| 5,255,094 A | 10/1993 | Yong et al. |
| 5,440,644 A | 8/1995 | Farinelli et al. |

(Continued)

FOREIGN PATENT DOCUMENTS

| | | |
|---|---|---|
| CN | 101257535 A | 9/2008 |
| CN | 102231774 A | 11/2011 |

(Continued)

OTHER PUBLICATIONS

Advisory Action dated Oct. 12, 2016, issued in connection with U.S. Appl. No. 14/939,958, filed Nov. 12, 2015, 3 pages.

(Continued)

*Primary Examiner* — Disler Paul
(74) *Attorney, Agent, or Firm* — FORTEM IP LLP; Benjamin Urban

(57) ABSTRACT

Embodiments described herein provide for detecting presence of an object in proximity to a playback device and responsively performing one or more operations. In an example implementation, a playback device detects, via a proximity detector of the playback device, presence of an object in proximity to the playback device. In response to detecting the presence of the object, the playback device performs one or more operations.

20 Claims, 7 Drawing Sheets

Related U.S. Application Data continuation of application No. 15/972,476, filed on May 7, 2018, now Pat. No. 10,552,116, which is a continuation of application No. 15/166,235, filed on May 26, 2016, now Pat. No. 9,965,245, which is a continuation of application No. 14/939,958, filed on Nov. 12, 2015, now Pat. No. 9,703,522, which is a continuation of application No. 13/536,250, filed on Jun. 28, 2012, now Pat. No. 9,225,307.

(56) References Cited

U.S. PATENT DOCUMENTS

| | | | |
|---|---|---|---|
| 5,761,320 | A | 6/1998 | Farinelli et al. |
| 5,822,598 | A | 10/1998 | Lam |
| 5,857,115 | A | 1/1999 | Tanaka |
| 6,032,202 | A | 2/2000 | Lea et al. |
| 6,122,749 | A | 9/2000 | Gulick |
| 6,148,345 | A | 11/2000 | Yamaki |
| 6,469,633 | B1 | 10/2002 | Wachter |
| 6,590,982 | B1 | 7/2003 | Chen |
| 6,643,744 | B1 | 11/2003 | Cheng |
| 6,690,431 | B1 | 2/2004 | Yang et al. |
| 6,778,869 | B2 | 8/2004 | Champion |
| 6,963,271 | B1 | 11/2005 | Fyffe |
| 6,970,940 | B1 | 11/2005 | Vogel et al. |
| 7,126,945 | B2 | 10/2006 | Beach |
| 7,295,548 | B2 | 11/2007 | Blank et al. |
| 7,483,538 | B2 | 1/2009 | McCarty et al. |
| 7,509,181 | B2 | 3/2009 | Champion |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,657,762 | B2 | 2/2010 | Orr |
| 7,689,304 | B2 | 3/2010 | Sasaki |
| 7,728,316 | B2 | 6/2010 | Fadell et al. |
| 7,853,341 | B2 | 12/2010 | McCarty et al. |
| 7,949,707 | B2 | 5/2011 | Mcdowall et al. |
| 7,957,762 | B2 | 6/2011 | Herz et al. |
| 7,987,294 | B2 | 7/2011 | Bryce et al. |
| 3,030,914 | A1 | 10/2011 | Alameh et al. |
| 8,045,952 | B2 | 10/2011 | Qureshey et al. |
| 8,055,364 | B2 | 11/2011 | Champion |
| 8,103,009 | B2 | 1/2012 | McCarty et al. |
| 8,111,132 | B2 | 2/2012 | Allen et al. |
| 8,148,622 | B2 | 4/2012 | Rothkopf et al. |
| 8,214,740 | B2 | 7/2012 | Johnson |
| 8,234,395 | B2 | 7/2012 | Millington |
| 8,332,414 | B2 | 12/2012 | Nguyen et al. |
| 8,381,135 | B2 | 2/2013 | Hotelling et al. |
| 8,407,623 | B2 | 3/2013 | Kerr et al. |
| 8,452,020 | B2 | 5/2013 | Gregg et al. |
| 8,483,853 | B1 | 7/2013 | Lambourne |
| 8,611,560 | B2 | 12/2013 | Goldstein et al. |
| 8,676,224 | B2 | 3/2014 | Louch |
| 8,843,586 | B2 | 9/2014 | Pantos et al. |
| 8,847,757 | B2 | 9/2014 | Kim et al. |
| 8,954,177 | B2 | 2/2015 | Sanders |
| 8,966,394 | B2 | 2/2015 | Gates et al. |
| 9,042,205 | B2 * | 5/2015 | Janik ............... G04G 13/021 368/13 |
| 9,137,602 | B2 | 9/2015 | Mayman et al. |
| 9,280,141 | B2 * | 3/2016 | Parker ............... G04C 21/02 |
| 9,494,683 | B1 | 11/2016 | Sadek |
| 9,645,786 | B2 * | 5/2017 | Khaira ............... G06F 3/0304 |
| 10,013,381 | B2 | 7/2018 | Mayman et al. |
| 10,198,239 | B2 * | 2/2019 | Khaira ............... G06F 3/0304 |
| 2001/0043592 | A1 | 11/2001 | Jimenez et al. |
| 2002/0072816 | A1 | 6/2002 | Shdema et al. |
| 2002/0101651 | A1 | 8/2002 | Dugan et al. |
| 2002/0124097 | A1 | 9/2002 | Isely et al. |
| 2003/0210796 | A1 | 11/2003 | McCarty et al. |
| 2005/0063556 | A1 | 3/2005 | McEachen et al. |
| 2005/0177256 | A1 | 8/2005 | Shintani et al. |
| 2005/0254669 | A1 | 11/2005 | Bose |
| 2006/0093998 | A1 | 5/2006 | Vertegaal et al. |
| 2006/0158168 | A1 | 7/2006 | Yoshida et al. |
| 2006/0182285 | A1 | 8/2006 | Warren et al. |
| 2006/0183505 | A1 | 8/2006 | Willrich |
| 2007/0142944 | A1 | 6/2007 | Goldberg et al. |
| 2007/0230723 | A1 | 10/2007 | Hobson et al. |
| 2007/0291955 | A1 | 12/2007 | Yamashita et al. |
| 2008/0069380 | A1 | 3/2008 | Cheng |
| 2008/0075295 | A1 | 3/2008 | Mayman et al. |
| 2008/0109956 | A1 | 5/2008 | Bayley et al. |
| 2008/0134102 | A1 * | 6/2008 | Movold ............... G06F 3/017 715/863 |
| 2008/0226087 | A1 | 9/2008 | Kinghorn |
| 2008/0260180 | A1 | 10/2008 | Goldstein et al. |
| 2008/0266083 | A1 | 10/2008 | Midholt et al. |
| 2008/0298606 | A1 | 12/2008 | Johnson et al. |
| 2009/0097689 | A1 | 4/2009 | Prest et al. |
| 2009/0102669 | A1 * | 4/2009 | Lin ............... G04G 21/08 340/575 |
| 2009/0134102 | A1 | 5/2009 | Cousins et al. |
| 2009/0139778 | A1 | 6/2009 | Butler et al. |
| 2009/0190767 | A1 | 7/2009 | Aaron et al. |
| 2009/0209293 | A1 | 8/2009 | Louch |
| 2009/0303176 | A1 | 12/2009 | Chen et al. |
| 2010/0045928 | A1 | 2/2010 | Levy |
| 2010/0046766 | A1 | 2/2010 | Gregg et al. |
| 2010/0064261 | A1 | 3/2010 | Andrews et al. |
| 2010/0171027 | A1 | 7/2010 | Yun |
| 2011/0003613 | A1 | 1/2011 | Ko et al. |
| 2011/0087842 | A1 | 4/2011 | Lu et al. |
| 2011/0109577 | A1 | 5/2011 | Lee et al. |
| 2011/0163859 | A1 | 7/2011 | Chraime et al. |
| 2011/0293102 | A1 | 12/2011 | Kitazawa et al. |
| 2011/0320612 | A1 | 12/2011 | Oka et al. |
| 2012/0021684 | A1 | 1/2012 | Schultz et al. |
| 2012/0044199 | A1 | 2/2012 | Karpin et al. |
| 2012/0121103 | A1 | 5/2012 | Cohen et al. |
| 2012/0157073 | A1 | 6/2012 | Kim et al. |
| 2012/0257768 | A1 | 10/2012 | Park et al. |
| 2012/0268145 | A1 | 10/2012 | Chandra et al. |
| 2012/0275617 | A1 | 11/2012 | Serve et al. |
| 2012/0318364 | A1 | 12/2012 | Sawaski et al. |
| 2013/0047084 | A1 | 2/2013 | Sanders et al. |
| 2013/0114823 | A1 | 5/2013 | Kari et al. |
| 2013/0167029 | A1 | 6/2013 | Friesen et al. |
| 2013/0279724 | A1 | 10/2013 | Stafford et al. |
| 2014/0006483 | A1 | 1/2014 | Garmark et al. |
| 2014/0075308 | A1 | 3/2014 | Sanders et al. |
| 2014/0108929 | A1 | 4/2014 | Garmark et al. |
| 2014/0123005 | A1 | 5/2014 | Forstall et al. |
| 2014/0133669 | A1 | 5/2014 | Klinghult et al. |
| 2014/0140530 | A1 | 5/2014 | Gomes-Casseres et al. |
| 2014/0378056 | A1 | 12/2014 | Liu et al. |
| 2015/0026613 | A1 | 1/2015 | Kwon et al. |
| 2015/0074527 | A1 | 3/2015 | Sevigny et al. |
| 2015/0074528 | A1 | 3/2015 | Sakalowsky et al. |
| 2015/0178038 | A1 | 6/2015 | Yliaho et al. |
| 2015/0256954 | A1 | 9/2015 | Carlsson et al. |

FOREIGN PATENT DOCUMENTS

| | | |
|---|---|---|
| EP | 1389853 A1 | 2/2004 |
| EP | 2194471 A1 | 6/2010 |
| JP | 2009218888 | 9/2009 |
| JP | 2010523018 | 7/2010 |
| JP | 20100277198 | 12/2010 |
| JP | 2012008801 | 1/2012 |
| KR | 1020110098556 A | 9/2011 |
| WO | 2003093950 A2 | 11/2003 |
| WO | 2008113053 | 9/2008 |
| WO | 2009090600 A1 | 7/2009 |
| WO | 2014149533 A2 | 9/2014 |

OTHER PUBLICATIONS

AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.

(56) References Cited

OTHER PUBLICATIONS

Chinese Patent Office, Chinese Office Action dated Jan. 12, 2017, issued in connection with Chinese Application No. 201380045237.5, 9 pages.
Chinese Patent Office, Fourth Office Action dated Nov. 16, 2017, issued in connection with Chinese Patent Application No. 201380045237.5, 15 pages.
Chinese Patent Office, Office Action dated Apr. 20, 2017, issued in connection with Chinese Application No. 201380045237.5, 17 pages.
Chinese Patent Office,Chinese Office Action dated Jun. 14, 2016, issued in connection with Chinese Application No. 201380045237.5, 7 pages.
Coolthings, "Philips Shoqbox SB7200 Brings Real Ruggedness To Mobile Speakers," Jun. 26, 2012, 12 pages URL: http://www.coolthings.com/philps-shoqbox-sb7200/.
"Denon 2003-2004 Product Catalog," Denon, 2003-2004, 44 pages.
European Patent Office, European EPC Article 94.3 dated Feb. 2, 2021, issued in connection with European Application No. 19174205.5, 5 pages.
European Patent Office, European Extended Search Report dated Feb. 5, 2016, issued in connection with European Application No. 13808471.0, 7 pages.
European Patent Office, European Extended Search Report dated Jan. 20, 2020, issued in connection with European Application No. 19174205.5, 15 pages.
European Patent Office, European Search Report dated Oct. 7, 2019, issued in connection with European Application No. 19174205.5, 17 pages.
European Patent Office, Office Action dated May 24, 2017, issued in connection with European Application No. 13808471.0, 5 pages.
European Patent Office, Summons to Attend Oral Proceedings dated Jul. 11, 2018, issued in connection with European Application No. 13808471.0, 7 pages.
Final Office Action dated Mar. 1, 2017, issued in connection with U.S. Appl. No. 15/166,235, filed May 26, 2016, 12 pages.
Final Office Action dated Sep. 2, 2015, issued in connection with U.S. Appl. No. 13/536,250, filed Jun. 28, 2012, 7 pages.
Final Office Action dated Aug. 3, 2016, issued in connection with U.S. Appl. No. 14/939,958, filed Nov. 12, 2015, 15 pages.
Final Office Action dated Dec. 10, 2014, issued in connection with U.S. Appl. No. 13/536,250, filed Jun. 28, 2012, 15 pages.
Final Office Action dated Mar. 12, 2019, issued in connection with U.S. Appl. No. 15/972,476, filed May 7, 2018, 26 pages.
International Bureau, International Preliminary Report on Patentability, dated Jan. 8, 2015, issued in connection with International Application No. PCT/US2013/048457, filed on Jun. 28, 2013, 6 pages.
International Searching Authority, International Search Report dated Oct. 22, 2014, issued in connection with International Application No. PCT/US2013/048457, filed on Jun. 28, 2013, 3 pages.
International Searching Authority, Written Opinion dated Oct. 22, 2014, issued in connection with International Application No. PCT/US2013/048457, filed on Jun. 28, 2013, 6 pages.
Japanese Patent Office, Notice of Final Rejection dated Dec. 6, 2016, issued in connection with Japanese Application No. 2015-520551, 6 pages.
Japanese Patent Office, Office Action dated Mar. 29, 2016, issued in connection with Japanese Patent Application No. JP2015-520551, 9 pages.
Jo et al., "Synchronized One-to-many Media Streaming with Adaptive Playout Control," Proceedings of SPIE, 2002, pp. 71-82, vol. 4861.
Non-Final Office Action dated Aug. 11, 2021, issued in connection with U.S. Appl. No. 16/779,634, filed Feb. 2, 2020, 26 pages.
Non-Final Office Action dated Aug. 14, 2017, issued in connection with U.S. Appl. No. 15/166,235, filed May 26, 2016, 14 pages.
Non-Final Office action dated Nov. 14, 2016, issued in connection with U.S. Appl. No. 15/166,235, filed May 26, 2016, 14 pages.
Non-Final Office Action dated Sep. 15, 2014, issued in connection with U.S. Appl. No. 13/536,250, filed Jun. 28, 2012, 12 pages.
Non-Final Office Action dated Apr. 23, 2015, issued in connection with U.S. Appl. No. 13/536,250, filed Jun. 28, 2012, 15 pages.
Non-Final Office Action dated Feb. 27, 2015, issued in connection with U.S. Appl. No. 13/536,250, filed Jun. 28, 2012, 17 pages.
Non-Final Office Action dated Nov. 5, 2018, issued in connection with U.S. Appl. No. 15/972,476, filed May 7, 2018, 21 pages.
Notice of Allowance dated Jan. 9, 2018, issued in connection with U.S. Appl. No. 15/166,235, filed May 26, 2016, 7 pages.
Notice of Allowance dated Oct. 9, 2015, issued in connection with U.S. Appl. No. 13/536,250, filed Jun. 28, 2012, 8 pages.
Notice of Allowance dated May 1, 2017, issued in connection with U.S. Appl. No. 14/939,958, filed Nov. 12, 2015, 8 pages.
Notice of Allowance dated Nov. 10, 2021, issued in connection with U.S. Appl. No. 16/779,634, filed Feb. 2, 2020, 8 pages.
Notice of Allowance dated Jan. 19, 2017, issued in connection with U.S. Appl. No. 14/939,958, filed Nov. 12, 2015, 8 pages.
Notice of Allowance dated Sep. 27, 2019, issued in connection with U.S. Appl. No. 15/972,476, filed May 7, 2018, 8 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

CONTROL BASED ON PROXIMITY

CROSS-REFERENCE TO RELATED APPLICATIONS

This application claims priority under 35 U.S.C. § 120 to, and is a continuation of, U.S. non-provisional patent application Ser. No. 16/779,634, filed on Feb. 2, 2020, entitled "Control Based on Proximity," which is incorporated herein by reference in its entirety.

This application claims priority under 35 U.S.C. § 120 to, and is a continuation of, U.S. non-provisional patent application Ser. No. 15/972,476, filed on May 7, 2018, entitled "Control Based on Proximity," and issued as U.S. Pat. No. 10,552,166 on Feb. 4, 2020, which is incorporated herein by reference in its entirety.

U.S. non-provisional patent application Ser. No. 15/972,476 claims priority under 35 U.S.C. § 120 to, and is a continuation of, U.S. non-provisional patent application Ser. No. 15/166,235, filed on May 26, 2016, entitled "Playback and Light Control Based on Proximity," and issued as U.S. Pat. No. 9,965,245 on May 8, 2018, which is incorporated herein by reference in its entirety.

U.S. non-provisional patent application Ser. No. 15/166,235 claims priority under 35 U.S.C. § 120 to, and is a continuation of, U.S. non-provisional patent application Ser. No. 14/939,958, filed on Nov. 12, 2015, entitled "Playback Control Based on Proximity," and issued as U.S. Pat. No. 9,703,522 on Jul. 11, 2017, which is incorporated herein by reference in its entirety.

U.S. non-provisional patent application Ser. No. 14/939,958 claims priority under 35 U.S.C. § 120 to, and is a continuation of, U.S. non-provisional patent application Ser. No. 13/536,250, filed on Jun. 28, 2012, entitled "Modification Of Audio Responsive To Proximity Detection," and issued as U.S. Pat. No. 9,225,307 on Dec. 29, 2015, which also is incorporated herein by reference in its entirety.

FIELD OF THE DISCLOSURE

The disclosure is related to consumer goods and, more particularly, to systems, products, features, services, and other items directed to media playback or some aspect thereof.

BACKGROUND

Technological advancements have increased the accessibility of music content, as well as other types of media, such as television content, movies, and interactive content. For example, a user can access audio, video, or both audio and video content over the Internet through an online store, an Internet radio station, a music service, a movie service, and so on, in addition to the more traditional avenues of accessing audio and video content. Demand for audio, video, and both audio and video content inside and outside of the home continues to increase.

BRIEF DESCRIPTION OF THE DRAWINGS

Features, aspects, and advantages of the presently disclosed technology are better understood with regard to the following description, appended claims, and accompanying drawings where:

Figure 1:
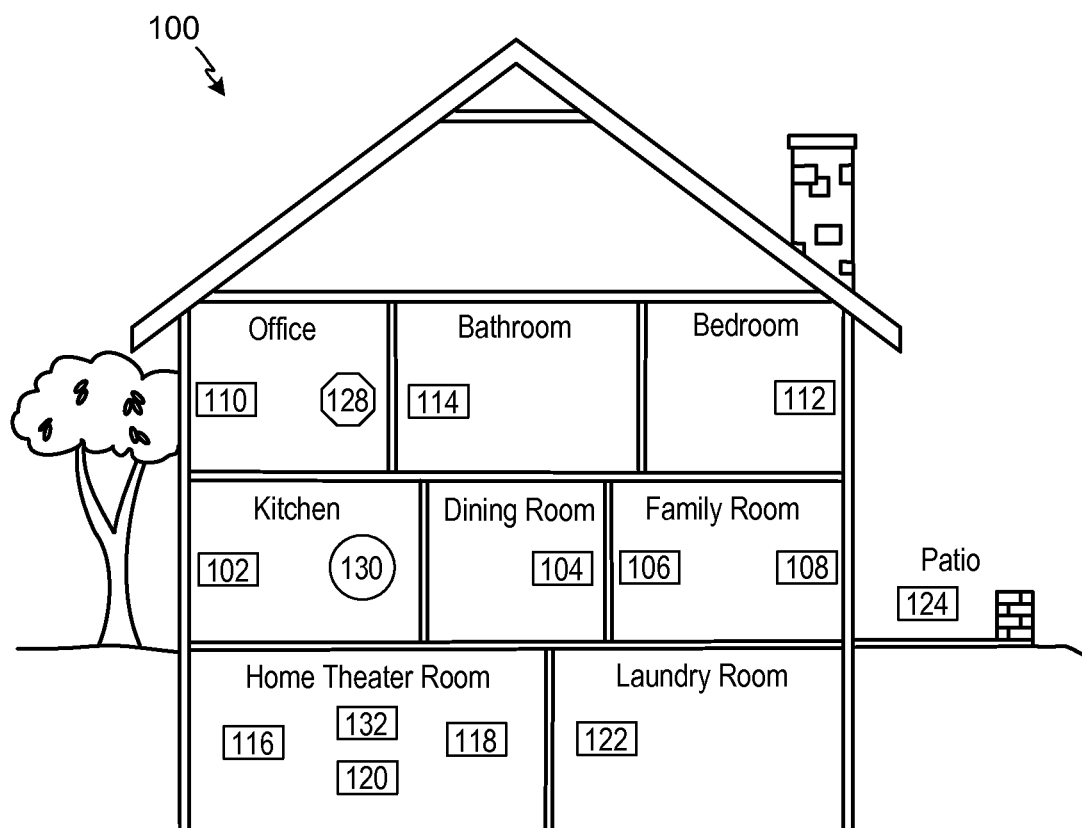
FIG. 1 shows an illustration of an example system in which embodiments of the methods and apparatus disclosed herein can be implemented.

In addition, the drawings are for the purpose of illustrating example embodiments, but it is understood that the present disclosure is not limited to the arrangements and instrumentality shown in the drawings.

DETAILED DESCRIPTION

I. Overview

Embodiments described herein provide for detecting movement in proximity to a playback device and responsively modifying the audio that is output from one or more playback devices. According to an embodiment, a user is able to wave his or her hand over a playback device to modify the audio that is output from the playback device, one or more different playback devices, or all of the playback devices. The embodiments are particularly useful as a snooze feature, in which an alarm from a playback device (or group of playback devices) is snoozed for a time when triggered by the user's movement. Playback can resume after the time has elapsed and the alarm and/or audio has not been turned off.

In an embodiment, modification of audio that is output from the playback device includes pausing playback of the audio. In another embodiment, modification of audio includes stopping playback of the audio. In yet another embodiment, modification of audio includes muting playback of the audio. In another embodiment, modification of audio includes reducing the volume level of the audio.

In an embodiment, the system intelligently looks to the source of audio and automatically determines whether the audio is to be paused (e.g., "pause snooze") or muted (e.g., "mute snooze"), and in some instances may be programmed to determine yet another action to be taken. For instance, if it is determined that the audio is from an Internet radio service that does not support pausing, then the system can mute playback. If it is determined that the audio is from a playlist or an Internet service that supports pausing, then the system can pause playback.

In an embodiment, the system lets the user to decide ahead of time what action is to be taken by the system (e.g., pause, stop, mute, and so on) depending on the source of audio. The user may be able to configure these options using a controller of the playback device (e.g., a Sonos controller, offered by SONOS, Inc. of Santa Barbara, Calif.). For instance, an audio source like Pandora can be muted or paused with different outcomes when playback resumes.

In an embodiment, a user can trigger the audio output modification by a movement of the hand or item over a sensor of a playback device. In an embodiment, the user may wave his or her hand over the playback device. For instance, the user can wave his or her hand (or some other item) within 6 inches of the surface of the playback device and without touching the playback device. In another embodiment, when an alarm is going off, the system automatically deactivates (or locks out) any relevant buttons and/or other functions so that the user may even hit the playback device without initiating another function.

The embodiments may be useful in other situations where the output of audio is to be modified responsive to proximity detection. For instance, proximity detection can be triggered to active other features if so programmed, such as a channel change, an advance in the playlist, an EQ change, and so on. Further, the embodiments may modify audio that is output from two or more playback devices in a zone group or zone groups. Systems, methods, apparatus, and articles of manufacture are disclosed herein.

II. An Example Operating Environment

Referring now to the drawings, in which like numerals can refer to like parts throughout the figures, FIG. 1 shows an example system 100 in which one or more embodiments disclosed herein can be practiced or implemented.

By way of illustration, system 100 represents a home presently configured with multiple zones, though the home could have been configured with only one zone. Each zone in the home, for example, may represent a different room or space, such as an office, bathroom, bedroom, kitchen, dining room, family room, home theater room, utility or laundry room, and patio. A single zone might also include multiple rooms if so configured. One or more of zone players 102-124 are shown in each respective zone of the home. A zone player 102-124, also referred to as a playback device, multimedia unit, speaker, player, and so on, provides audio, video, and/or audiovisual output. Controller 130 provides control to system 100. Controller 130 may be fixed to a zone, or alternatively, mobile such that it can be moved about the zones. System 100 may also include more than one controller 130. System 100 illustrates an example whole house audio system, though it is understood that the technology described herein is not limited to its particular place of application or to an expansive system like a whole house audio system 100 of FIG. 1.

a. Example Zone Players

Figure 2A:
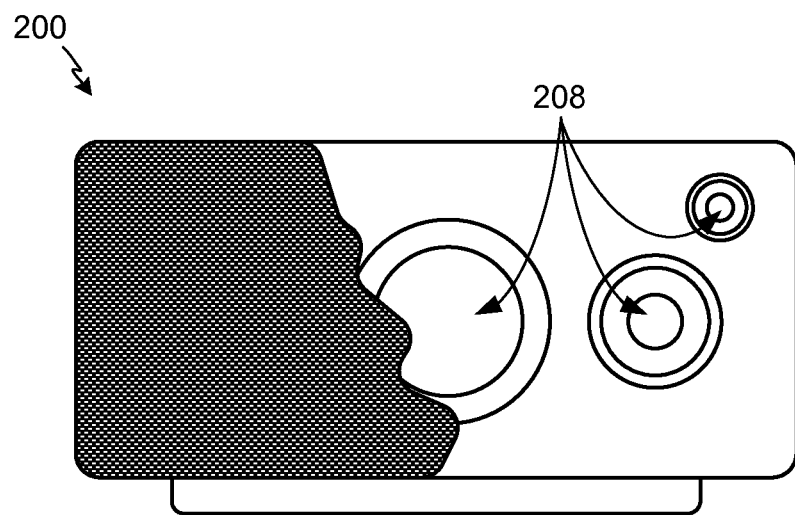
FIG. 2A shows an illustration of an example zone player having a built-in amplifier and speakers.
Figure 2B:
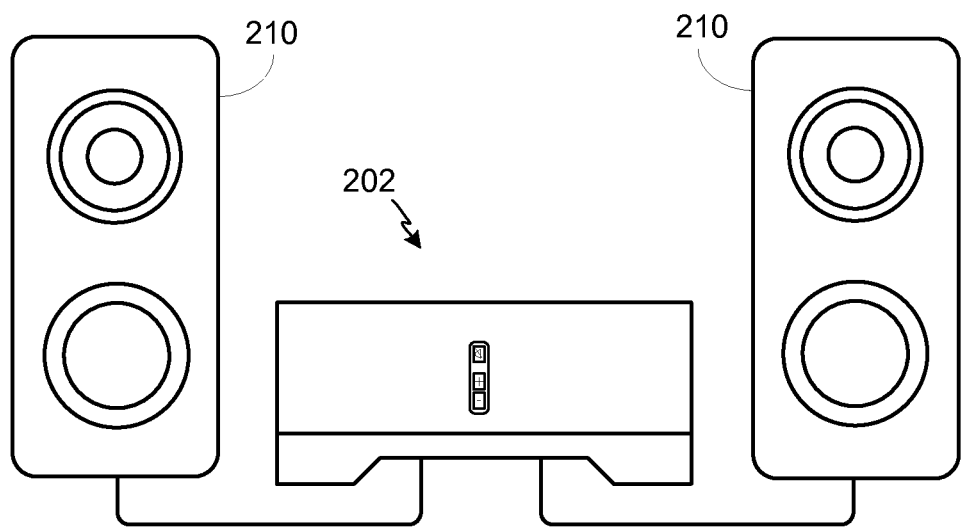
FIG. 2B shows an illustration of an example zone player having a built-in amplifier and connected to external speakers.
Figure 2C:
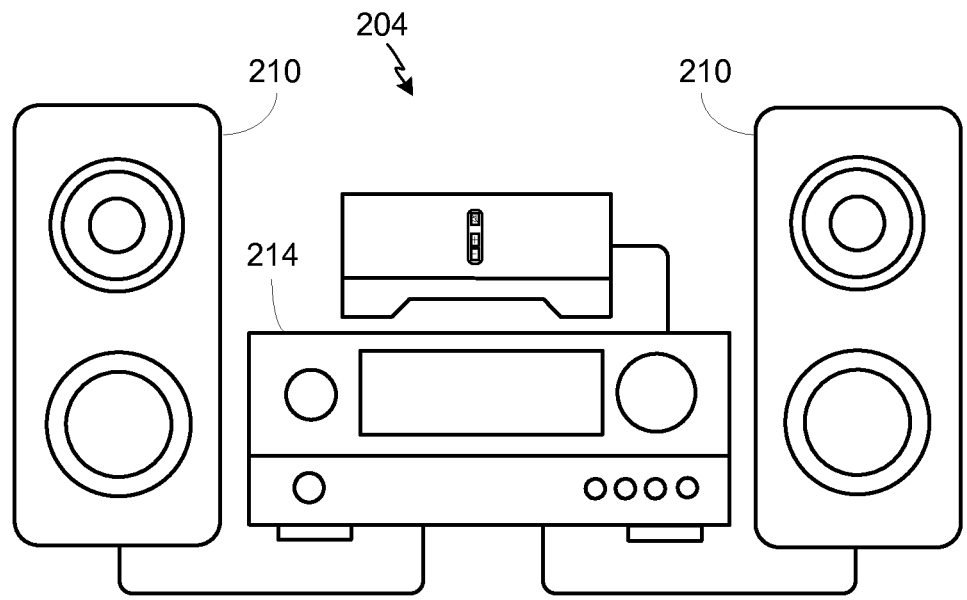
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more speakers. A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 is configured to reproduce a subset of full-range sound, such as when zone player 200 is grouped with other zone players to play stereophonic audio, monaural audio, and/or surround audio or when the audio content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a zone player may contain a playlist or queue of audio items to be played (also referred to herein as a "playback queue"). Each item in the queue may comprise a uniform resource identifier (URI) or some other identifier. The URI or identifier can point the zone player to the audio source. The source might be found on the Internet (e.g., the cloud), locally from another device over data network 128, the controller 130, stored on the zone player itself, or from an audio source communicating directly to the zone player. In some embodiments, the zone player can reproduce the audio itself, send it to another zone player for reproduction, or both where the audio is played by the zone player and one or more additional zone players in synchrony. In some embodiments, the zone player can play a first audio content (or not play at all), while sending a second, different audio content to another zone player(s) for reproduction.

By way of illustration, SONOS, Inc. of Santa Barbara, Calif. presently offers for sale zone players referred to as a "PLAY:5," "PLAY:3," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player can include or interact with a docking station for an Apple iPod™ or similar device.

b. Example Controllers

Figure 3:
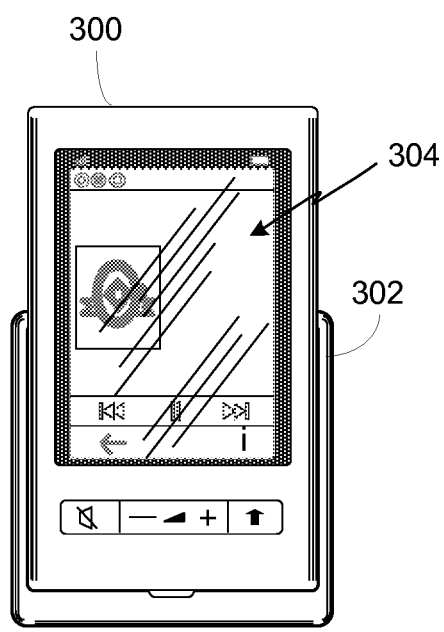
FIG. 3 shows an illustration of an example controller.

FIG. 3 illustrates an example wireless controller 300 in docking station 302. By way of illustration, controller 300 can correspond to controlling device 130 of FIG. 1. Docking station 302, if provided, may be used to charge a battery of controller 300. In some embodiments, controller 300 is provided with a touch screen 304 that allows a user to interact through touch with the controller 300, for example, to retrieve and navigate a playlist of audio items, control operations of one or more zone players, and provide overall control of the system configuration 100. In certain embodiments, any number of controllers can be used to control the system configuration 100. In some embodiments, there can be a limit set on the number of controllers that can control the system configuration 100. The controllers might be wireless like wireless controller 300 or wired to data network 128.

In some embodiments, if more than one controller is used in system 100, then each controller may be coordinated to display common content, and may all be dynamically updated to indicate changes made from a single controller. Coordination can occur, for instance, by a controller periodically requesting a state variable directly or indirectly from one or more zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an IPHONE™, IPAD™, ANDROID™ powered phone, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers offered by SONOS, Inc. of Santa Barbara, Calif. include a "Controller 200," "Sonos CONTROL," "Sonos® Controller for iPhone," "SONOS Controller for IPAD™," "SONOS® Controller for ANDROID, "SONOS® Controller for MAC or PC."

c. Example Data Connection

Zone players 102 to 124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players 102-124 are wirelessly coupled to data network 128 using a non-mesh topology. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, if a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players (also referred to as "bonded zone players") can play audio in synchrony with other zone players in the same or different zones.

In some embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device can be set in a consolidated mode, for example.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, music on a zone player itself may be accessed and played. In some embodiments, music from a personal library stored on a computer or networked-attached storage (NAS) may be accessed via the data network 128 and played. In some embodiments, Internet radio stations, shows, and podcasts can be accessed via the data network 128. Music or cloud services that let a user stream and/or download music and audio content can be accessed via the data network 128. Further, music can be obtained from traditional sources, such as a turntable or CD player, via a line-in connection to a zone player, for example. Audio content can also be accessed using a different protocol, such as AIRPLAY™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 can be shared with any of the zone players 102-124 in the audio system 100.

III. Zone Players

Figure 4:
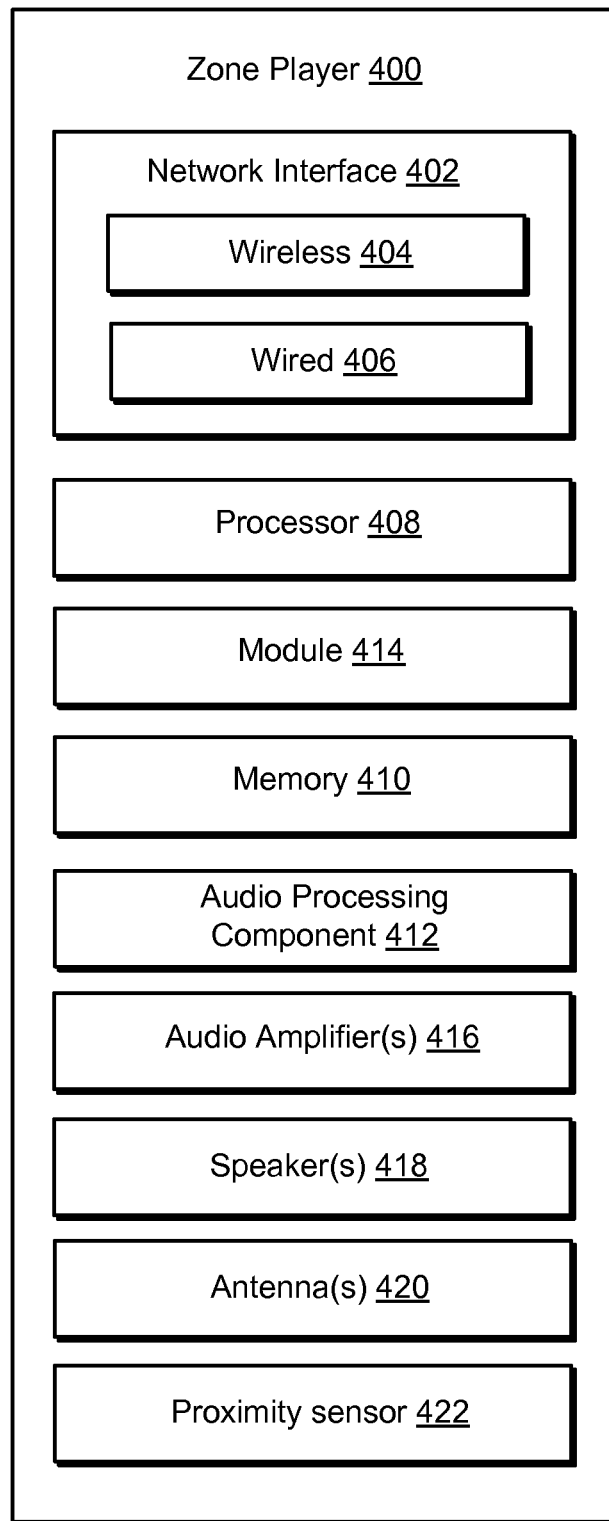
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. Zone player 400 also includes at least one proximity sensor 422. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, or 802.15). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for play back through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5, is a zone player with a built-in amplifier and speakers that is capable of retrieving audio directly from the source, such as on the Internet or on the local network, for example. In particular, the PLAY:5 is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies, but from different channels of audio. Audio from Internet radio stations, online music and video services, downloaded music, analog audio inputs, television, DVD, and so on, can be played from the PLAY:5. The PLAY:5 may be configured with a proximity sensor 422.

Proximity sensor 422 is a sensor able to detect the presence of nearby object, such as a human hand, without any physical contact. In an embodiment, the proximity sensor 422 emits an electromagnetic field or a beam of electromagnetic radiation and examines the return signal or field for changes. In an embodiment, proximity sensor 422 may be used to light up or activate a user interface on zone player 400, such as capacitive buttons positioned on an exterior surface of the zone player 400. In an embodiment, the proximity sensor 422 may be used according to the embodiments described herein to modify audio output. In another embodiment, the proximity sensor 422 may be used to do multiple functions such as activate a UI on the playback device and modify audio output from the playback device, one or more different playback devices, or all playback devices.

In some embodiments, proximity sensor 422 can detect a user's hand as it is moved near and/or over the sensor 422 to trigger a snooze feature. The user does not need to touch the zone player 400. However, in some embodiments, should the user "slap" the zone player 400, it can also trigger the snooze feature as the hand motion will trigger proximity sensor 422.

In some embodiments, when an alarm is playing via zone player 400, proximity sensor 422 may lock out certain buttons (e.g., capacitive buttons) for a moment so that the user can snooze by either waving his or her hand near and/or over the sensor 422 or just hitting the top of the product (which might be easier to accomplish when the user is still groggy from sleep).

In some embodiments, if an alarm is not playing via zone player 400, proximity sensor 422 is no longer configured for snooze and is programmed to activate certain buttons (e.g., capacitive buttons) so that the user can see and select a button. In some embodiments, the buttons can change functionality and/or appearance based on the time of day, the audio content that is playing through the playback device, and so on.

In some embodiments, a timeout on the snooze feature is defined such that if the alarm has been playing for a certain amount of time (e.g., 10 minutes), the snooze is disabled automatically and the system reverts to the standard control behavior (e.g., using a controller). For instance, a user may wish to continue listening to the audio via zone player 400 versus modifying it by snooze. Even after snooze, a user may wish to listen to the audio and therefore the system resumes playback.

In some embodiments, proximity sensor 422 can detect movement and provide one or more commands to a different zone player on the playback network. For instance, audio output of another zone player may be modified based on the detection of movement by proximity sensor 422. In some embodiments, proximity sensor 422 can detect movement and provide an indication to a different zone player on the playback network or to a different, but authorized, playback network (e.g., two friends on different playback networks may wake up to the same or similar alarm and one can be notified when snooze has been pressed by the other, for example).

IV. Controller

Figure 5:
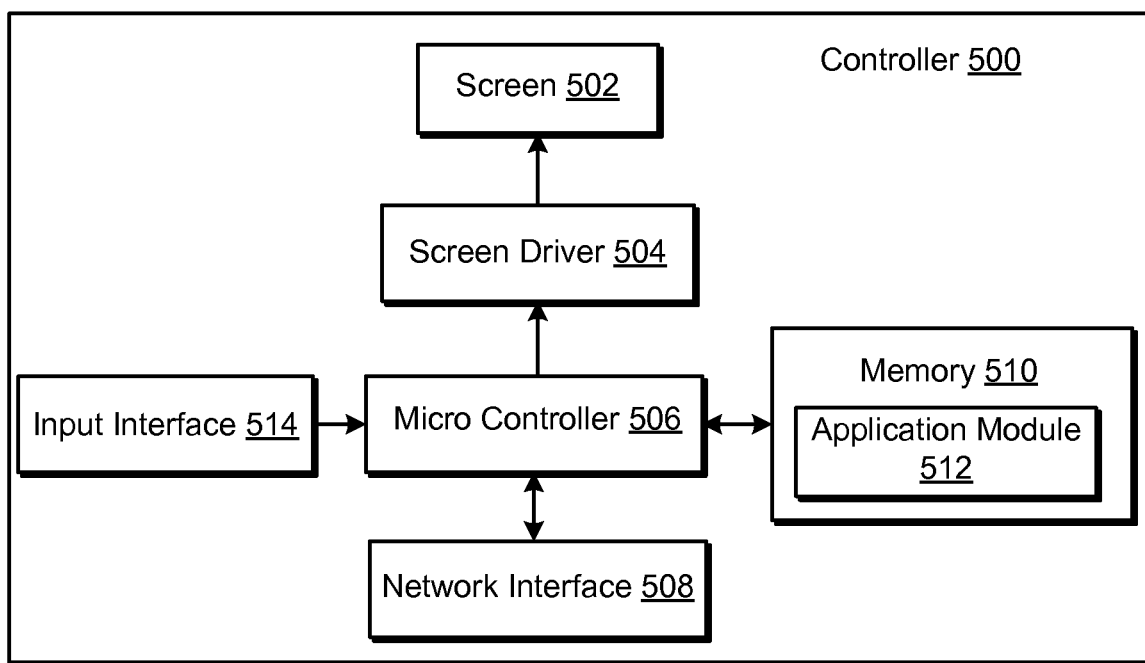
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b 802.11g, 802.11n, or 802.15, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio play back. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an IPHONE®, WAD® or any other smart phone or network-enabled device (e.g., a networked computer such as a PC or MAC®) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group play back an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed action. Other kinds of zone scenes can be programmed.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Example Process for Modifying Output Based on Detected Movement

Figure 6:
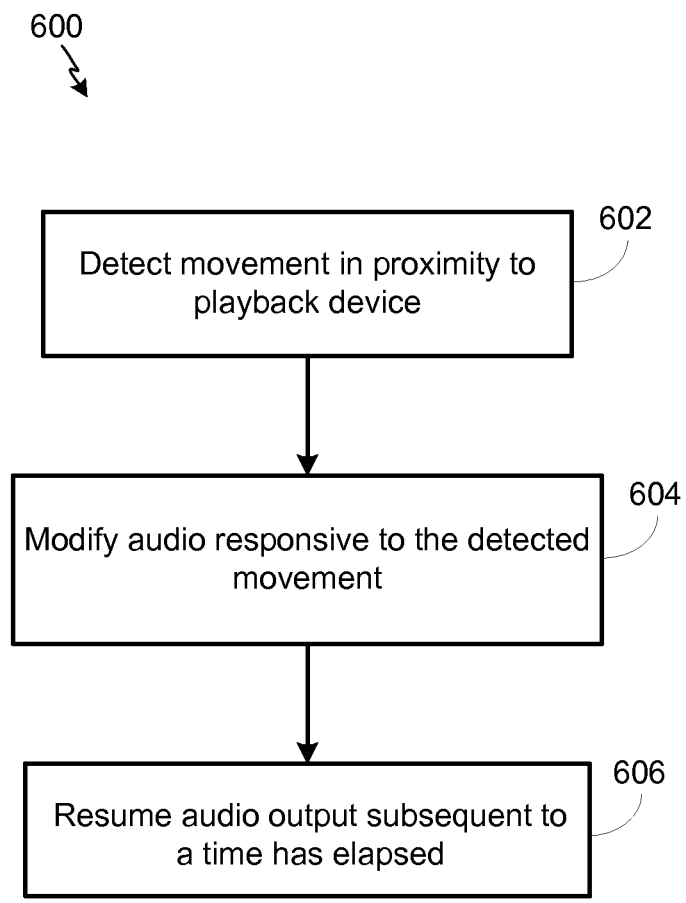
FIG. 6 shows a flow diagram according to an embodiment.

FIG. 6 shows an example process 600 for modifying the output of audio from a playback device responsive to detected motion. The process 600 may be used for any type of media, including audio and video or both. Aspects of the process 600 may be implemented on a single device, such as a zone player or a controller, or a combination of devices, such as a zone player and a controller. Process 600 may further be implemented by a device that is neither a zone player nor a controller.

Figure 7:
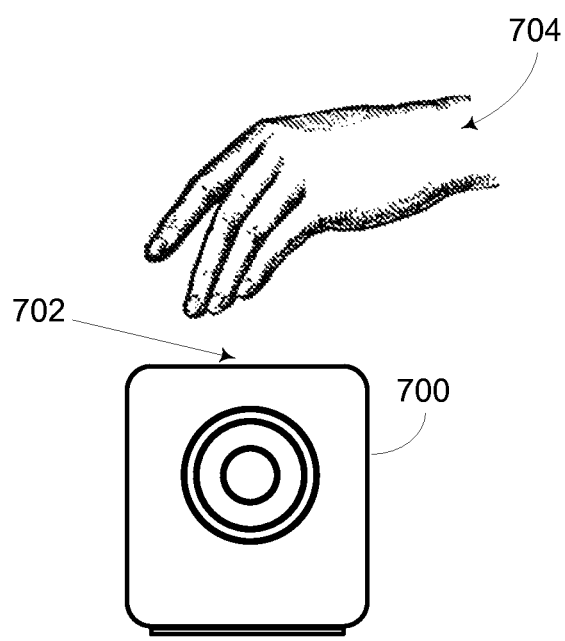
FIG. 7 shows an example illustration according to an embodiment.

At block 602, a proximity sensor detects movement. In one embodiment, a proximity sensor or sensors may be placed on one side, or many sides, of a zone player. Looking to FIG. 7, a playback device 700 contains a proximity sensor at 702. In another embodiment, a proximity sensor is on another device, such as a smart phone or other computing device, but such sensor controls the playback device.

In an embodiment, a user can trigger the audio output modification by a movement of the hand or item over a sensor of a playback device. By way of illustration, a user's hand 704 moving over playback device 700 in FIG. 7 can trigger the proximity sensor 702. In an embodiment, the user can wave his or hand (or some other item) within 6 inches (as an example) of the surface of the playback device and without touching the playback device. The sensitivity of the proximity sensor may be determined by the type of proximity sensor used and/or the designer's choice.

In another embodiment, when an alarm is going off via the playback device, the system automatically deactivates (or locks out) any relevant buttons and/or other functions so that the user may even hit the playback device (even accidentally) without initiating another function. For example, if other buttons were placed near proximity sensor 702 in FIG. 7, the buttons' functions may be deactivated when an alarm is going off. In yet another embodiment, the system temporarily deactivates buttons when the system recognizes that the audio being played is due to an alarm and within a set period of time after the alarm starts playing.

At block 604, audio that is output from a playback device or group of playback devices is modified based on the detected movement. For instance, if a zone player (or zone group) is playing an alarm (using audio from a designated source), then the detected movement will snooze the alarm on the zone player (or zone group).

In an embodiment, modification of audio that is output from the playback device includes pausing playback of the audio. In another embodiment, modification of audio includes stopping playback of the audio. In yet another embodiment, modification of audio includes muting playback of the audio. In another embodiment, modification of audio includes reducing the volume level of the audio.

In an embodiment, the modification to audio applies to the previously configured alarm logic and applies to all grouped zones that are part of the alarm. As such, if the alarm is set to include a grouped zone, then snooze can automatically include the grouped zones.

In an embodiment, the system intelligently looks to the source of audio and automatically determines whether the audio is to be paused (e.g., "pause snooze") or muted (e.g., "mute snooze"), and in some instances may be programmed to determine yet another action to be taken. For instance, if it is determined that the audio is from an Internet radio service that does not support pausing, then the system can mute playback. If it is determined that the audio is from a playlist or an Internet service that supports pausing, then the system can pause playback.

In an embodiment, the system lets the user to decide ahead of time what action is to be taken by the system (e.g., pause, stop, mute, and so on) depending on the source of audio. The user may be able to configure these options using a controller of the playback device (e.g., a Sonos controller, offered by SONOS, Inc. of Santa Barbara, Calif.). For instance, an audio source like Pandora can be muted or paused with different outcomes when playback resumes.

At block 606, if the alarm has not been shut off, then the audio may be resumed subsequent to an elapsed time. In some embodiments, the alarm may be configured by the user including how long a snooze lasts (e.g., 10 minutes).

The embodiments may be useful in other situations where the output of audio is to be modified responsive to proximity detection. For instance, proximity detection can be triggered to activate other features if so programmed, such as a channel change, an advance in the playlist, an EQ change, and so on. Further, the embodiments may modify audio that is output from two or more playback devices in a zone group or zone groups. Systems, methods, apparatus, and articles of manufacture are disclosed herein.

Additionally, the embodiments may be useful to modify an output other than audio (or in addition to audio). For example, the modification may be applied to a light that turns on when an alarm is activated. As such, movement detected by the proximity sensor may modify the light, such as lower the intensity or turn it off. Another kind of output may include video.

VI. Conclusion

Many embodiments and examples have been disclosed. In an embodiment, a user can configure snooze options in a controller when setting up an alarm via a playback device. The snooze feature by proximity detection may be on by default, or off by default. When the snooze by proximity detection is turned "ON" then the system would snooze for a time when triggered, resuming playback after the time has elapsed. The time can be user configured.

In an embodiment, when playback is resumed, the system can either pick right back up where the audio left off (e.g., "pause snooze") or continue as if the playlist had been running all along (e.g., "mute snooze"). In another embodiment, depending on the audio source, the system may choose the pause or mute behavior (or other behavior) automatically. For instance, an Internet radio station may be muted while a playlist or Pandora type station can be paused. In another instance, the system can make the mute/pause/other an option for certain music sources that can support multiple options.

In an embodiment, the proximity sensor is different from the capacitive or other types of buttons on the top of the product in that its range is specifically calibrated to be much larger. In one example, to trigger the proximity sensor the user only has to wave their hand over the product within 4-6 inches of the surface. Preferably, the user will not need to actually touch the product. However should the user "slap" the top of the product, it may also trigger the snooze as the hand motion will trigger the proximity sensor. In an embodiment, when the snooze (proximity sensor) is activated, the capacitive buttons are locked out for a second or so such that the user can snooze by either waving their hand over the product or just hitting the top of the product (which is easier to accomplish when the user is still groggy from sleep). According to some embodiments, this described technology is an improvement over current solutions where a user has to press a specific button on the product to achieve snooze. Other improvements over current systems are described above.

In an embodiment when used in a snooze feature, a proximity sensor enables the widest range of motions as possible to modify the audio as the user is typically uncoordinated when just waking up. In another embodiment, the snooze behavior can change depending on how long the alarm has been playing. For example, most snoozing takes place relatively quickly after the alarm starts playing. As such, a timeout can be defined on the snooze feature such that if the alarm has been playing for a time that exceeds the timeout, the snooze is disabled automatically and the playback device reverts to the standard control behavior. This may avoid some of the complications of stopping the alarm after the user awakes and leaves the house.

The description discloses various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

Additionally, reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

The invention claimed is:

1. A playback device comprising:
   a network interface;
   a touch-sensitive display;
   a proximity sensor configured to detect presence of a user at a greater range than a capacitive range of the touch-sensitive display;
   one or more audio transducers;
   at least one processor; and
   a housing configured to carry the network interface, the touch-sensitive display, the proximity sensor, the one or more audio transducers; and the at least one processor;
   at least one non-transitory computer-readable medium storing program instructions that are executable by the at least one processor such that the playback device is configured to:
      receive input data representing a pre-selected alarm time corresponding to an alarm;
      according to the pre-selected alarm time: (i) play back particular audio content via the one or more audio transducers and (ii) cause one or more lights to be illuminated;
      while the particular audio content is playing back and the one or more lights are illuminated, detect, via the proximity sensor, presence of a user in proximity to the playback device;
      in response to detection of the presence of the user in proximity to the playback device: (i) temporarily stop playback of the particular audio content and (ii) temporarily reduce an illumination intensity of the one or more lights;
      after a pre-determined period of time: (i) resume playback of the particular audio content and (ii) increase the illumination intensity of the one or more lights; and
      play back additional audio content in synchrony with one or more additional playback devices.

2. The playback device of claim 1, wherein the instructions that are executable by the at least one processor such that the playback device is configured to temporarily reduce the illumination intensity of the one or more lights comprise instructions that are executable by the at least one processor such that the playback device is configured to:
   cause, via the network interface, the one or more lights to reduce illumination intensity.

3. The playback device of claim 1, wherein the instructions that are executable by the at least one processor such that the playback device is configured to temporarily reduce the illumination intensity of the one or more lights comprise instructions that are executable by the at least one processor such that the playback device is configured to:
   cause the one or more lights to temporarily turn off.

4. The playback device of claim 1, wherein the touch-sensitive display comprises at least one light of the one or more lights, wherein the instructions that are executable by the at least one processor such that the playback device is configured to temporarily reduce the illumination intensity of the one or more lights comprise instructions that are executable by the at least one processor such that the playback device is configured to:
   modify a video output.

5. The playback device of claim 1, further comprising program instructions that are executable by the at least one processor such that the playback device is configured to:
   after the alarm is deactivated, activate a pre-configured routine.

6. The playback device of claim 5, wherein the particular audio content is first audio content, wherein the instructions that are executable by the at least one processor such that the playback device is configured to activate the pre-configured routine comprise instructions that are executable by the at least one processor such that the playback device is configured to:
   cause two or more playback devices to form a group; and
   play back second audio content via the one or more audio transducers.

7. The playback device of claim 1, further comprising program instructions that are executable by the at least one processor such that the playback device is configured to:
   detect that a clock time corresponds to the pre-selected alarm time of the alarm, wherein playing back the particular audio content according to the pre-selected alarm time comprises:
      in response to detection that the clock time corresponds to the pre-selected alarm time, play back the particular audio content.

8. The playback device of claim 1, further comprising program instructions that are executable by the at least one processor such that the playback device is configured to:
   detect that the pre-determined period of time has elapsed; and
   in response to the detection that the pre-determined period of time has elapsed, (i) resume the playback of the particular audio content and (ii) increase the illumination intensity of the one or more lights.

9. The playback device of claim 1, wherein the instructions that are executable by the at least one processor such that the playback device is configured to play back the particular audio content via the one or more audio transducers comprise instructions that are executable by the at least one processor such that the playback device is configured to play back the particular audio content in synchrony with the one or more additional playback devices.

10. The playback device of claim 1, wherein the instructions that are executable by the at least one processor such that the playback device is configured to receive input data representing the pre-selected alarm time comprise instructions that are executable by the at least one processor such that the playback device is configured to:
    receive, via the touch-sensitive display, the input data representing the pre-selected alarm time.

11. A system comprising:
    a playback device comprising a touch-sensitive display, a proximity sensor configured to detect presence of a user at a greater range than a capacitive range of the touch-sensitive display, and one or more audio transducers;
    a network interface;
    at least one processor; and
    at least one non-transitory computer-readable medium storing program instructions that are executable by the at least one processor such that the system is configured to:
       receive input data representing a pre-selected alarm time corresponding to an alarm;
       according to the pre-selected alarm time: (i) play back particular audio content via the one or more audio transducers and (ii) cause one or more lights to be illuminated;

while the particular audio content is playing back and the one or more lights are illuminated, detect, via the proximity sensor, presence of a user in proximity to the playback device;

in response to detection of the presence of the user in proximity to the playback device: (i) temporarily stop playback of the particular audio content and (ii) temporarily reduce an illumination intensity of the one or more lights;

after a pre-determined period of time: (i) resume playback of the particular audio content and (ii) increase the illumination intensity of the one or more lights; and play back additional audio content in synchrony with one or more additional playback devices.

12. The system of claim 11, wherein the instructions that are executable by the at least one processor such that the system is configured to temporarily reduce the illumination intensity of the one or more lights comprise instructions that are executable by the at least one processor such that the system is configured to:

cause, via the network interface, the one or more lights to reduce illumination intensity.

13. The system of claim 11, wherein the system further comprises the one or more lights.

14. The system of claim 11, wherein the instructions that are executable by the at least one processor such that the system is configured to temporarily reduce the illumination intensity of the one or more lights comprise instructions that are executable by the at least one processor such that the system is configured to:

cause the one or more lights to temporarily turn off.

15. The system of claim 11, wherein the touch-sensitive display comprises at least one light of the one or more lights, wherein the instructions that are executable by the at least one processor such that the system is configured to temporarily reduce the illumination intensity of the one or more lights comprise instructions that are executable by the at least one processor such that the system is configured to:

modify a video output.

16. The system of claim 11, further comprising program instructions that are executable by the at least one processor such that the system is configured to:

after the alarm is deactivated, activate a pre-configured routine.

17. The system of claim 16, wherein the particular audio content is first audio content, wherein the instructions that are executable by the at least one processor such that the system is configured to activate the pre-configured routine comprise instructions that are executable by the at least one processor such that the system is configured to:

cause two or more playback devices to form a group; and
play back second audio content via the one or more audio transducers.

18. The system of claim 11, further comprising program instructions that are executable by the at least one processor such that the system is configured to:

detect that a clock time corresponds to the pre-selected alarm time of the alarm, wherein playing back the particular audio content according to the pre-selected alarm time comprises:

in response to detection that the clock time corresponds to the pre-selected alarm time, play back the particular audio content.

19. The system of claim 11, further comprising program instructions that are executable by the at least one processor such that the system is configured to:

detect that the pre-determined period of time has elapsed; and in response to the detection that the pre-determined period of time has elapsed, (i) resume the playback of the particular audio content and (ii) increase the illumination intensity of the one or more lights.

20. A tangible, non-transitory computer-readable medium comprising program instructions that are executable by at least one processor such that a playback device is configured to:

receive input data representing a pre-selected alarm time corresponding to an alarm;

according to the pre-selected alarm time: (i) play back particular audio content via one or more audio transducers and (ii) cause one or more lights to be illuminated;

while the particular audio content is playing back and the one or more lights are illuminated, detect, via a proximity sensor, presence of a user in proximity to the playback device, wherein the playback device comprises a touch-sensitive display, and wherein the proximity sensor is configured to detect presence of a user at a greater range than a capacitive range of the touch-sensitive display;

in response to detection of the presence of the user in proximity to the playback device: (i) temporarily stop playback of the particular audio content and (ii) temporarily reduce an illumination intensity of the one or more lights;

after a pre-determined period of time: (i) resume playback of the particular audio content and (ii) increase the illumination intensity of the one or more lights; and play back additional audio content in synchrony with one or more additional playback devices.

* * * * *

UNITED STATES PATENT AND TRADEMARK OFFICE
CERTIFICATE OF CORRECTION

| | | |
|---|---|---|
| PATENT NO. | : 11,789,692 B2 | Page 1 of 1 |
| APPLICATION NO. | : 17/562547 | |
| DATED | : October 17, 2023 | |
| INVENTOR(S) | : Jonathon Reilly et al. | |

It is certified that error appears in the above-identified patent and that said Letters Patent is hereby corrected as shown below:

In the Claims

In Column 15, in Claim 1, Line 15, after "transducers" delete ";" and insert -- , --, therefor.

Signed and Sealed this
Second Day of January, 2024

*Katherine Kelly Vidal*

Katherine Kelly Vidal
*Director of the United States Patent and Trademark Office*